United States Patent [19]

Douville et al.

[11] Patent Number: 4,914,382
[45] Date of Patent: Apr. 3, 1990

[54] HIGH VOLTAGE MEASURING CIRCUIT COUPLED TO THE CAPACITIVE GROUNDING TAP BUSHING OF AN HV DEVICE

[75] Inventors: Jean Douville, Beloeil; Ryszard Malewski, St-Lambert; Louis Lavallée, Beloeil, all of Canada

[73] Assignee: Hydro-Quebec, Montreal, Canada

[21] Appl. No.: 263,079

[22] Filed: Oct. 27, 1988

Related U.S. Application Data

[63] Continuation-in-part of Ser. No. 108,000, Oct. 14, 1987, abandoned.

[51] Int. Cl.$^4$ .................. G01R 1/20; G01R 19/00
[52] U.S. Cl. .................. 324/127; 324/102; 324/111; 324/126
[58] Field of Search .................. 324/126, 142, 57 R, 324/59, 102, 111, 127

[56] References Cited

U.S. PATENT DOCUMENTS

| | | | |
|---|---|---|---|
| 1,795,207 | 3/1931 | Frick | 324/126 |
| 1,981,716 | 11/1934 | Austin | 324/126 |
| 3,226,641 | 12/1965 | Miller | 324/142 |
| 3,870,927 | 3/1975 | Hughes | 324/126 |
| 4,374,359 | 2/1983 | Missout | 324/126 |
| 4,477,772 | 10/1984 | So | 324/59 |
| 4,777,428 | 10/1988 | Lundback | 324/57 R |

Primary Examiner—Ernest F. Karlsen
Attorney, Agent, or Firm—Oblon, Spivak, McClelland, Maier & Neustadt

[57] ABSTRACT

A high voltage measuring circuit for broadband measurement of transient signals occurring in high voltage apparatus. The measuring circuit is housed in a shielded housing having an input sensing circuit for connection to a capacitive grounded tap of the high voltage apparatus. The sensing circuit is connected to an output circuit through an electrical shielded connection. The measuring circuit generates output signals which are replicas of the transient signals appearing on the bushing of the high voltage apparatus. The broadband of the measuring circuit extends over a frequency range of from about 1 Hz to 1 MHz and has a signal level higher than background noise.

7 Claims, 3 Drawing Sheets 4,914,382

HIGH VOLTAGE MEASURING CIRCUIT COUPLED TO THE CAPACITIVE GROUNDING TAP BUSHING OF AN HV DEVICE

This application is a Continuation-in-Part application of U.S. Application Ser. No. 108,000 filed Oct. 14, 1987, now abandoned.

BACKGROUND OF INVENTION

1. Field of Invention

The present invention relates to a high voltage measuring circuit which is surged to a capacitive grounding tap bushing of a high voltage power equipment, such as a high voltage transformer, whereby to reproduce transient fault signals that occur on such high voltage apparatus.

2. Description of Prior Art

Various high voltage measuring circuits have been developed to measure fault signals on high voltage circuits. However, such circuits do not operate over a wide frequency range, they are complex and costly to construct, and the output signal of such known equipment is often affected by environmental electric or magnetic fields.

SUMMARY OF INVENTION

It is a feature of the present invention to provide a high voltage measuring circuit for reproducing transient signals occurring in a high voltage circuit, and which substantially overcomes the above-mentioned disadvantages of the prior art, and wherein the measuring circuit is connected to a capacitive grounding tap bushing of such high voltage power equipment.

According to another feature of the present invention there is provided a high voltage measuring circuit which is isolated from magnetic and electric perturbances and which is capable of reproducing transient signals occurring in high voltage transformers and within a frequency range of between 1 Hz to 1 MHz, and wherein the high voltage measuring circuit is connected to the capacitive grounded bushing of the transformer.

According to the above features, from a broad aspect, the present invention provides a high voltage measuring circuit for broadband measurement of transient signals occurring in high voltage apparatus. The measuring circuit is housed in a shielded housing having an input sensing circuit for connection to a capacitive grounded tap of the high voltage apparatus. The sensing circuit is connected to an output circuit through an electrical shielded connection. The measuring circuit generates output signals which are replicas of the transient signals appearing on the bushing of the high voltage apparatus. The broadband of the measuring circuit extends over a frequency range of from about 1 Hz to 1 MHz and has a signal level higher than background noise.

In a preferred embodiment of the high voltage measuring circuit of the present invention the measuring circuit is connected to the capacitive grounded tap bushing of a high voltage transformer.

BRIEF DESCRIPTION OF DRAWINGS

The present invention will now be described with reference to the accompanying drawings in which.

DESCRIPTION OF PREFERRED EMBODIMENTS

Figure 1:
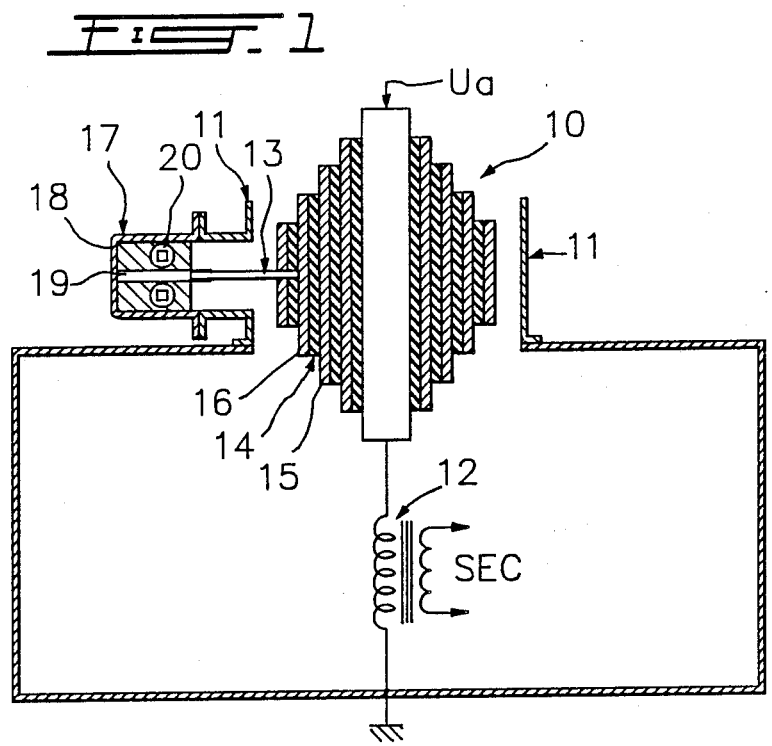
FIG. 1 is a fragmented view showing the high voltage measuring circuit of the present invention connected to a capacitive grounding tap bushing of a high voltage transformer.

Referring to the drawings, and more particularly to FIG. 1, there is shown a simplified diagram of a capacitive grounded tap bushing 10 having a casing 11 connected to the grounded housing of a high voltage transformer 12. The tap comprises a tap conductor 13 which is usually utilized to test the capacitance of the bushing which is constituted by the insulation 14 layered in the bushing. The insulation is comprised of alternate layers of insulating paper 15 and aluminum foil 16 which are in contact with the bushing casing 11. Usually the current is measured in the outermost foil 16 of the insulation 14, which foil is grounded.

The high voltage measuring circuit 17 of the present invention is housed, at least in part, within a casing 18 which is constructed of steel having a high permeability whereby to shield the components therein against the environmental magnetic field. A coupling 19 connects the primary of the current transformer 20 to the conductor 13. The casing 18 is secured to the bushing 10 by suitable fasteners (not shown).

Figure 2:
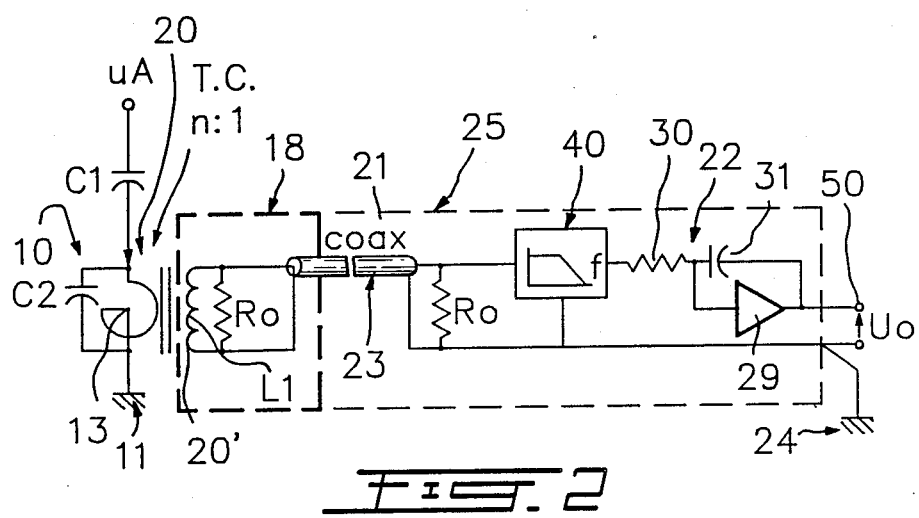
FIG. 2 is a simplified schematic diagram of the high voltage measuring circuit of the present invention.

Referring now to FIG. 2, there will be described the construction of the high voltage measuring circuit 17 of the present invention. As shown in FIG. 2, the capacitive bushing 10 is schematically illustrated by the capacitors $C_1$ and $C_2$ and conductor 13. This capacitive tap has a certain resonant frequency. The current in the tap is measured by a miniature current transformer 20 and the voltage across the taps of the coil 20' of the transformer is proportional to the second derivative of the voltage present on the bushing. In order to obtain a replica of this voltage, the signal at the output of the current transformer winding 20' is twice integrated. The first integration is obtained by a passive LR circuit 21 consisting of the inductance of the secondary coil 20' of the transformer and its load resistance, herein $R_O$ and $R_O'$ connected in parallel. This load resistance is equal to about 25 ohm. $R_O$ and $R_O'$ are coupling resistances for coaxial cable 23 and each have a value of 50 ohms. The integration circuit 22 constitutes a second integration circuit which purpose is to reproduce a signal that is proportional to the input voltage UA.

After the first integration by the LR circuit 21 the signals become proportional to the first derivative of the measured voltage. The second integration is accomplished by the amplifier 29, the resistor 30 and the capacitor 31.

A low pass filter 40 of the Bessel type and of the 6th order is connected to the input of the integrator amplifier 29, and has a cut-off frequency of 1 MHz. Its function is to eliminate the resonance frequency of the capacitive bushing. This resonance frequency appears at about 3 MHz. The filter also provides an adequate frequency response over the operating range of the measuring circuit.

In order for adequate operation at low frequencies, the current transformer 20 must be efficiently shielded against parasitic magnetic fields and the earth's magnetic field. This is made possible by placing the current transformer 20 in a steel housing 18 having a high permeability. The coaxial cable 23, as well as all of the electronic components of the measuring circuit, are also disposed in the interior of a shield 25 in order not to be affected by any electromagnetic or high frequency electric fields. The ground symbol 11 represents the grounded connection of a transformer while the ground symbol 24 represents an earth ground at the output measuring terminals 50.

It is pointed out that essentially three conditions have to be fulfilled to attain a constant transformation ratio of up to about 3 MHz. Firstly, the miniature current transformer (MCT) ration shall not be higher than 200:1, since a higher ratio implies a higher number of turns of the secondary winding, and this results in an excessive stray inductance and capacitance which give rise to resonant frequencies falling into the measuring bandwidth. Secondly, the physical size of the MCT core shall be restrained to approximately 5 cm in outer diameter in order to minimize the leakage magnetic flux. Thirdly, the secondary winding has to be uniformly distributed over the MCT core circumference and the burden resistor shall be tapped to the winding section at approximately every 20 turns. This is needed in order to reduce the effect of eccentricity of the primary magnetic flux in the core. A description of the principle of operation of such a current transformer was published by John M. Anderson, "Wide frequency range current transformers", The Review of Scientific Instruments, Vol. 42, No. 7, July 1971.

Figure 4:
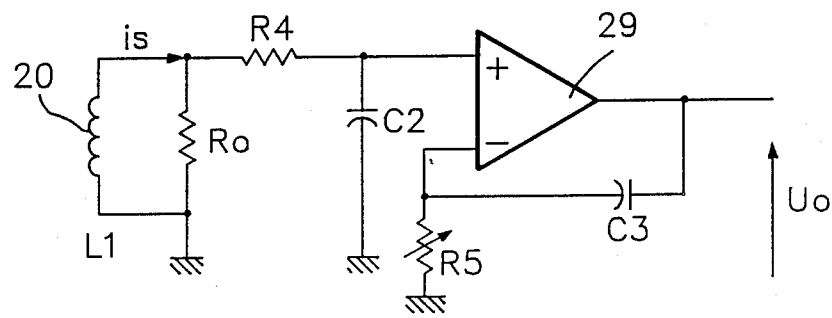
FIG. 4 is a detailed schematic diagram of the high voltage measuring circuit of the present invention.

The integration circuit, as shown in FIG. 2, must be able to integrate the voltage appearing at its input up to 120 db extending over a frequency range of 1 Hz to 1 MHz. It is therefore difficult, while maintaining an acceptable signal to noise ratio, to cover a frequency range of this magnitude. In order to solve this problem, a combined passive and active integrator is utilized as shown in FIG. 4. The passive portion of the integrator is constituted by resistor $R_4$ and capacitor $C_2$, and the active part is constituted by the amplifier 29 and its associated resistor $R_5$ and capacitor $C_3$. The transfer equation is given by the following expression:

$$\frac{Uo}{i_s} = \frac{Ro}{\omega R5C3} \times \frac{(1 + \omega R5C3)}{(1 + \omega R4C2)}$$

Figure 3:
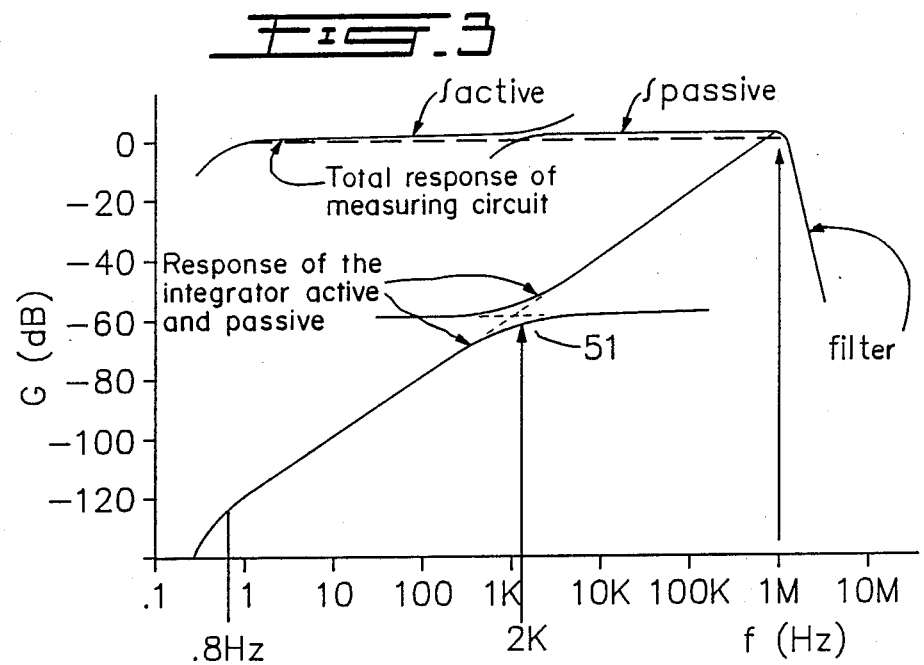
FIG. 3 is a characteristic diagram showing the response of the circuit over a frequency range of from 1 Hz to 1 MHz.

The crossing point of the active and passive integrators is exact when the relationship of the expression $$(1 + \omega R5C3)/(1 + \omega R4C2)$$

is unitary. The overlapped frequency is of the range of 2 KHz, as shown in FIG. 3. FIG. 3 is a characteristic representation showing the operation of a measuring circuit over the frequency range of 1 Hz to 1 MHz. The overlapping of the active and passive integrators is illustrated at 51.

Figure 5A:
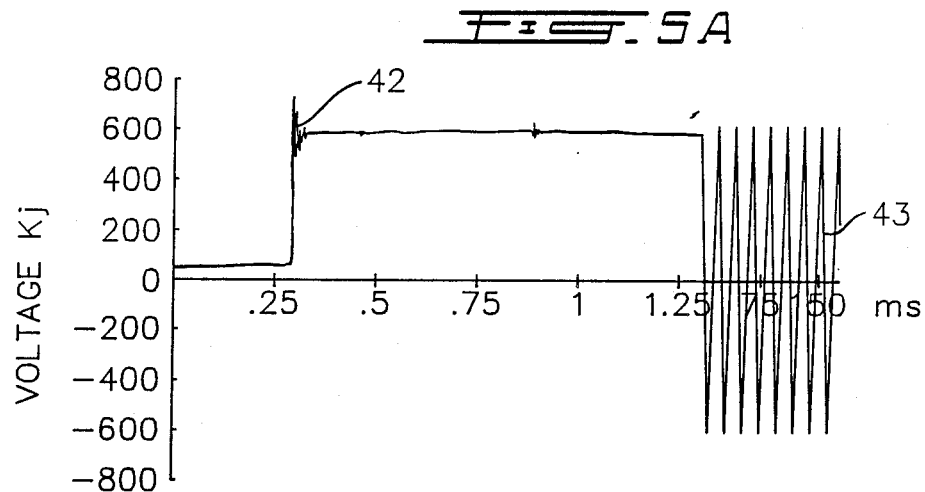
FIG. 5A is a characteristic curve of a high voltage circuit on which there is shown a fault signal.
Figure 5B:
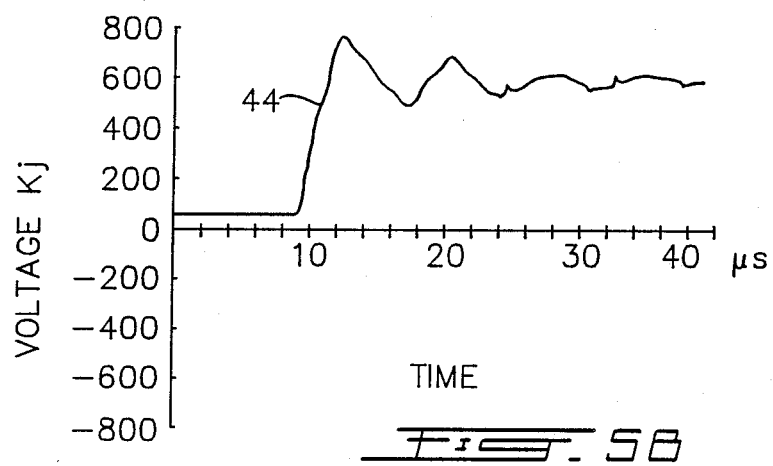
FIG. 5B is a characteristic curve of the fault signal as shown on an expanded scale.

Referring now to FIG. 5A, there is shown a typical transient fault signal which occurs when closing a high voltage switch. The transient fault signal is identified by reference numeral 42 and appears at the peak voltage of the 60 Hz signal 43. This fault signal is illustrated on a magnified scale in FIG. 5B and, as can be seen, it has a very sharp front 44 over a very short rise time. This is a typical type of transient fault signal that the measuring circuit of the present invention can monitor whether appearing on the positive or negative cycle of the signal. Another typical type of fault that is monitored is that which occurs during an explosion in a transformer. This type of monitoring provides valuable information concerning the nature and severity of the fault signals on particular high voltage power equipment, such as high voltage transformers.

It is within the ambit of the present invention to cover any obvious modifications of the examples of the preferred embodiment described herein, provided such modifications fall within the scope of the appended claims.

We claim:

1. A high voltage measuring circuit for broadband measurement of transient signals occurring in high voltage apparatus, said measuring circuit being housed in a shielded housing, said measuring circuit having an input sensing circuit for connection to a capacitive grounded tap bushing of a high voltage apparatus, said sensing circuit having an electrical shielded connection connected to an output circuit, said measuring circuit having means to generate output signals which are replicas of the high voltage transient signals appearing on said tap bushing, said measuring circuit having a broadband which extends over a frequency band of from about 1 Hz to 1 MHz and has a signal level higher than background noise, said input sensing circuit having an input current transformer, said current transformer having a primary winding connected to the said capacitive grounded tap busing and to a bushing flange, said transformer having a sufficient number of turns in its secondary winding to maintain a constant transformation ratio up to about 3 MHz, said secondary winding of said current transformer having its output integrated by a passive integrator and an active integrator acting respectively in the low and high frequency spectrum of said frequency band and ensuring a constant ratio of the input and output signals of said frequency band of the said measuring circuit.

2. A high voltage measuring circuit as claimed in claim 1 wherein said passive integrator is constituted by an RC circuit connected to said secondary, said active integrator being comprised of an amplifier and a feedback circuit.

3. A high voltage measuring circuit as claimed in claim 2 wherein said integrators have a transfer equation expressed by the following expression:

$$\frac{Uo}{i_s} = \frac{Ro}{\omega R5C3} \times \frac{(1 + \omega R5C3)}{(1 + \omega R4C2)}$$

the crossing point of said active and passive integrators is exact when the relationship of said expression is unitary and expressed mathematically by:

$$(1 + \omega R5C3)/(1 + \omega R4C2)$$

4. A high voltage measuring circuit as claimed in claim 1 wherein said transformer has a low output resistance of about 25 ohms which acts as an integrator over said broadband frequency range.

5. A high voltage measuring circuit as claimed in claim 1 wherein said output circuit comprises a low pass filter of the 6th order which is connected to said secondary winding of said current transformer, said filter having a cut-off frequency of about 1 MHz whereby to remove the resonance frequency of said bushing which is situated at about 3 MHz and provides a regularity shaped (aperiodical) step response of the said measuring circuit.

6. A high voltage measuring circuit as claimed in claim 1 wherein said shielded housing is a steel housing having a high permeability to protect said measuring circuit from environmental magnetic fields.

7. A high voltage measuring circuit as claimed in claim 1 wherein the input of said measuring circuit and the output thereof are both separately connected to earth and are electrically isolated from one another.

* * * * *